United States Patent
Komino et al.

[11] Patent Number: 6,156,151
[45] Date of Patent: Dec. 5, 2000

[54] PLASMA PROCESSING APPARATUS

[75] Inventors: Mitsuaki Komino; Junichi Arami, both of Tokyo; Koichi Yatsuda, Yamanashi-ken, all of Japan

[73] Assignee: Tokyo Electron Limited, Tokyo, Japan

[21] Appl. No.: 08/895,993

[22] Filed: Jul. 17, 1997

[30] Foreign Application Priority Data

Jul. 19, 1996 [JP] Japan .................................. 8-208846
Oct. 3, 1996 [JP] Japan .................................. 8-282987

[51] Int. Cl.[7] .............................. C23F 1/02; C23C 16/00
[52] U.S. Cl. ...................... 156/345; 118/723 R; 118/715
[58] Field of Search ...................... 118/723 VE, 723 R, 118/719, 715; 156/345 P, 345

[56] References Cited

U.S. PATENT DOCUMENTS

| | | | |
|---|---|---|---|
| 5,209,803 | 5/1993 | Powell | 156/345 |
| 5,242,539 | 9/1993 | Kumihashi et al. | 156/643 |
| 5,389,197 | 2/1995 | Ishimaru | 156/643 |
| 5,523,261 | 6/1996 | Sandhu | 437/228 |
| 5,525,159 | 6/1996 | Hama et al. | 118/713 I |
| 5,779,803 | 7/1998 | Kuruno | 118/723 R |
| 5,916,454 | 6/1999 | Richardson et al. | 216/67 |

OTHER PUBLICATIONS

Kazunori Tsujimoto, et al., Journal of Vacuum Science and Technology: Part A, vol. 12, No. 4, pp. 1209–1215, Jul./Aug. 1994, "Short–Gas–Residence–Time–Electron Cyclotron Resonance Plasma Etching".

*Primary Examiner*—Harold Pyon
*Assistant Examiner*—Liza Pacheco
*Attorney, Agent, or Firm*—Oblon, Spivak, McClelland, Maier & Neustadt, P.C.

[57] ABSTRACT

A plasma etching apparatus has a central processing chamber, an upper exhaust chamber thereabove, and a lower exhaust chamber therebelow. The processing chamber, the upper exhaust chamber, and the lower exhaust chamber are airtightly formed by a central casing part, an upper casing part, and a lower casing part which are separably combined. The upper and lower exhaust chambers are respectively connected to upper and lower exhaust pumps. A susceptor having a support surface for supporting a target object, and an upper electrode or shower head opposing it are arranged in the processing chamber. A processing gas spouted through the shower head flows upward and downward toward the upper and lower exhaust chambers via the processing chamber.

20 Claims, 10 Drawing Sheets

PLASMA PROCESSING APPARATUS

BACKGROUND OF THE INVENTION

The present invention relates to an apparatus for performing a predetermined process including etching and deposition for a target object, such as a semiconductor wafer or an LCD substrate by using a plasma generated by discharge.

In a process of manufacturing, e.g., a semiconductor device, a plasma is generated in a processing vessel to perform various plasma processes including etching for a target object such as a semiconductor wafer in this plasma atmosphere. FIG. 11 is a schematic view showing the arrangement of a conventional plasma etching apparatus. In the apparatus of this type, upper and lower electrodes 12 and 14 are arranged to oppose each other in a processing chamber 10, as shown in FIG. 11. A plurality of processing gas spouting holes 18 are formed in the lower surface (i.e., a surface opposing the target object) of the upper electrode 12. An evacuation system 22 is connected to the lower side of the processing chamber 10 via a baffle plate 20.

In etching, a processing gas is supplied to the processing chamber 10 through the spouting holes 18 while evacuating the processing chamber 10. An RF power is applied from an RF power supply 16 to the lower electrode 14 (in some cases, an RF power is also applied to the upper electrode 12) to convert the processing gas into a plasma. By the plasma generated in this manner, a target object W is etched.

In recent years, the capacity of the processing chamber increases along with increases in diameter and size of the target object, requiring a higher effective exhaust rate. However, owing to the conductance of the baffle plate 20 for preventing the plasma from entering the evacuation system, a satisfactory effective exhaust rate cannot be obtained only by increasing the capacity of the vacuum pump of the evacuation system.

The processing chamber 10 is constituted by assembling a plurality of parts 10a to 10d. For this reason, even if the conductivity between the respective parts 10a to 10d is improved as much as possible, the potentials (V1 to V4) of the respective parts 10a to 10d are different. As a result, the plasma is difficult to be confined in the processing space (above the target object) within the processing chamber. This problem is becoming more serious as the diameter and size of the target object increase.

The top plate of the processing chamber constituting the upper electrode 12 is freely openable. By opening this top plate, the inside of the processing chamber can be maintained. However, when the inner wall of the processing chamber is damaged, its repair is very difficult to perform.

To optimize the processing apparatus for each process, the processing gas, the plasma, and the flow of an exhaust gas or the like in the processing chamber must be controlled in accordance with each process. More particularly, parameters such as the flow rate of the processing gas to be supplied to the processing chamber, the diameter of the gas supply hole, the size of the gas supply region, the number of exhaust holes, and the exhaust amount of exhaust gas are desirably adjusted, as needed. However, adjustment of the parameters for each process is very cumbersome, resulting in an increase in initial cost.

BRIEF SUMMARY OF THE INVENTION

It is an object of the present invention to provide a plasma processing apparatus capable of ensuring a high effective exhaust rate so as to cope with a large-diameter, or large-size target object.

It is another object of the present invention to provide a plasma processing apparatus capable of effectively confining a plasma within a processing chamber.

It is still another object of the present invention to provide a plasma processing apparatus in which the inside of the processing chamber is easily subjected to a maintenance operation.

It is still another object of the present invention to provide a plasma processing apparatus in which the flows of a processing gas, a plasma, an exhaust gas, and the like in the processing chamber can be easily controlled for each process.

According to a first aspect of the present invention, there is provided an apparatus for processing a target object using a plasma, comprising:

an airtight processing chamber;

a work table having a support surface for supporting the target object in the processing chamber;

upper and lower exhaust systems for exhausting a gas from the processing chamber, and evacuating an interior of the processing chamber, the upper and lower exhaust systems flowing gas in the processing chamber upward and downward, respectively;

a gas supply system for supplying a processing gas to the processing chamber; and an electric field generator for generating, in the processing chamber, an electric field for converting the processing gas into a plasma through discharge.

According to a second aspect of the present invention, there is provided an apparatus for processing a target object using a plasma, comprising:

an airtight processing chamber;

a work table having a support surface for supporting the target object in the processing chamber;

an exhaust system for exhausting a gas from the processing chamber, and evacuating an interior of the processing chamber;

a gas supply system for supplying a processing gas to the processing chamber; and an electric field generator for generating, in the processing chamber, an electric field for converting the processing gas into a plasma through discharge, wherein the processing chamber, except for the support surface of the work table, is defined by a central casing part having an integrally continuous inner wall surface exposed in the processing chamber, and a potential on the inner wall surface is set substantially uniform.

According to the present invention, a gas is exhausted by separate evacuation systems from exhaust chambers set above and below a processing chamber. Even when the diameter and size of a target object increase, a sufficient effective exhaust rate can be ensured regardless of the conductances of upper and lower exhaust holes for communicating the upper and lower exhaust chambers with the processing chamber.

According to the present invention, since the upper exhaust chamber, the processing chamber, and the lower exhaust chamber which constitute a plasma processing apparatus can be easily separated, the inside of the processing apparatus can be subjected to a maintenance operation easily and rapidly.

According to the present invention, since the processing chamber is defined by an integrally continuous inner wall surface, except for a lower electrode portion, the potential in the processing chamber can be uniformed, so that the plasma can be effectively confined in the processing space.

According to the present invention, if the difference in exhaust amount between the upper and lower exhaust systems is kept constant, an optimal gas flow can be formed in the processing chamber. Therefore, uniform plasma processing can be performed for the target object at a high selectivity and a high etching rate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
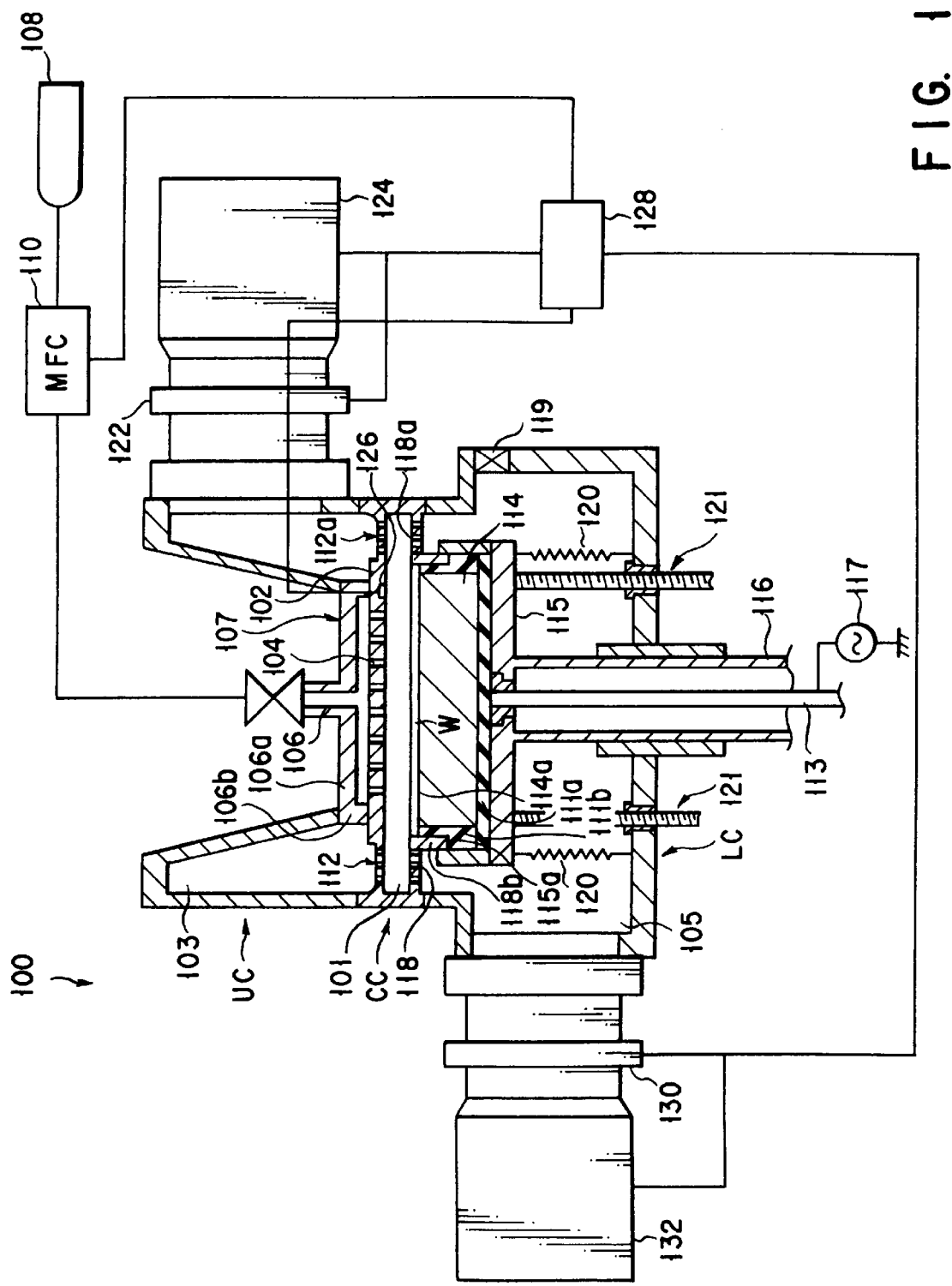
FIG. 1 is a schematic view showing the arrangement of a plasma etching apparatus as a plasma processing apparatus according to an embodiment of the present invention.
Figure 2:
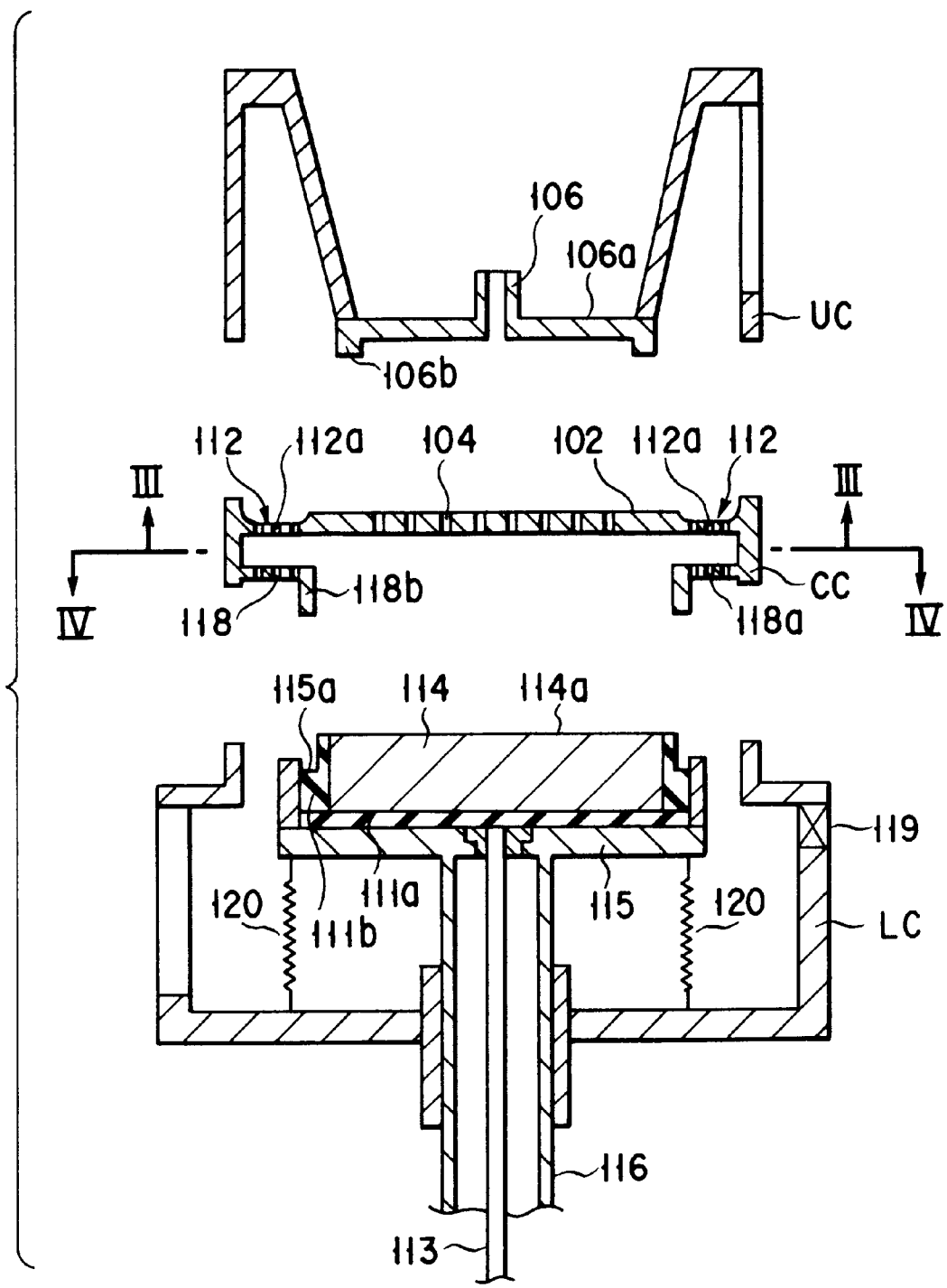
FIG. 2 is a schematic exploded sectional view showing the apparatus shown in FIG. 1.

FIG. 1 is a schematic view showing the arrangement of a plasma etching apparatus 100 as a plasma processing apparatus according to an embodiment of the present invention. The etching apparatus 100 has a central processing chamber 101, an upper exhaust chamber 103 thereabove, and a lower exhaust chamber 105 therebelow. The processing chamber 101, the upper exhaust chamber 103, and the lower exhaust chamber 105 are airtightly formed by three casing parts combined separably, i.e., a central casing part CC, an upper casing part UC, and a lower casing part LC. FIG. 2 is a schematic sectional view showing the separated states of the casing parts CC, UC, and LC of the apparatus 100 shown in FIG. 1.

The processing chamber 101 is substantially defined by the central casing part CC except for a lower electrode (to be described later), i.e., the support surface of a susceptor 114. The central casing part CC is prepared by integrally molding a conductive material such as aluminum into an almost cylindrical shape. Its inner surface is substantially smooth and anodized. That is, the substantially smooth, integrally continuous inner wall surface is exposed in the processing chamber 101, except for the support surface of the susceptor 114.

According to this embodiment, the surface of the anodized film on the inner wall surface of the processing chamber 101 is covered with a coating to protect the anodized surface. This coating material includes PBI (polybenzimidazole) and a polyimide resin. As will be described later, a recoating process can be easily performed because the central casing part CC defining the processing chamber 101 can be easily detached from the plasma etching apparatus 100. Therefore, when any damage to the coating material is found, after processing of a predetermined lot completes, or after a predetermined time elapses, the recoating process can be performed for the processing chamber 101. With this process, damage to the processing chamber 101 by the plasma can be prevented to suppress occurrence of contamination from the damaged portion, and to prolong the service life of the processing chamber 101.

Figure 3:
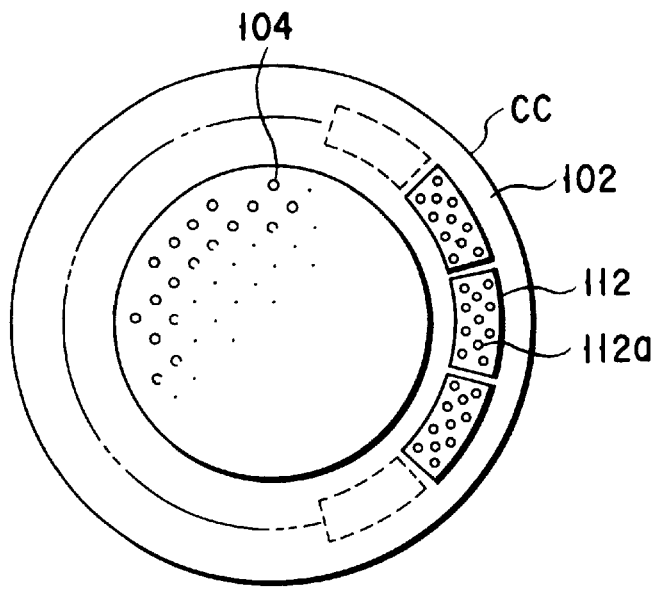
FIG. 3 is a schematic sectional view showing the state of an upper exhaust chamber side taken along the line III—III in FIG. 2 when viewed from a processing chamber side.

A ceiling 102 of the processing chamber 101 is formed to function as an upper electrode and as a shower head 107 for supplying a processing gas. For this purpose, many gas supply holes 104 are formed in almost the central portion (surface opposing the target object) of the ceiling 102, as shown in FIG. 3. The central and upper casing parts CC and UC are combined to airtightly form the shower head 107 at the center of the doughnut-like upper exhaust chamber 103 so as to be isolated from the upper exhaust chamber 103.

In the assembled state, the gas supply holes 104 communicate with a processing gas supply pipe 106 which stands at almost the center of the upper exhaust chamber 103 and is integrated with the upper casing part UC. The supply pipe 106 is connected to a processing gas source 108 via a mass-flow controller (MFC) 110. The processing gas from the processing gas source 108 is uniformly spouted into the processing chamber through the gas supply holes 104, while its flow rate is controlled by the MFC 110. FIG. 3 is a sectional view of the ceiling 102 of the processing chamber 101 taken along the line III—III in FIG. 2 when viewed from the processing chamber 101 side toward the upper exhaust chamber 103 side.

The upper casing part UC is connected to the lower end of the processing gas supply pipe 106, and has a cup 106a horizontally widening so as to cover the region where the gas supply holes 104 are formed. In assembling, an edge portion 106b of the cup 106a airtightly contacts the upper surface of the ceiling 102 to airtightly form the shower head 107 having the gas supply holes 104. As the processing gas, various gases can be used in accordance with the type of plasma processing. To etch a silicon oxide film ($SiO_2$), a CF-based gas such as $CF_4$ gas or $CHF_3$ gas can be used as an etching gas.

As shown in FIG. 3, an upper baffle plate 112 having many upper exhaust holes 112a formed therein is arranged at the peripheral portions of the ceiling 102 of the processing chamber 101. When the central and upper casing parts CC and UC are combined to form the doughnut-like upper exhaust chamber 103, the processing chamber 101 and the upper exhaust chamber 103 are partitioned by the upper baffle plate 112, and communicate with each other through the upper exhaust holes 112a. The diameter of the upper exhaust hole 112a and the installation area of the upper baffle plate 112 are designed to prevent the plasma from entering the upper exhaust chamber 103 and to keep the conductance in exhaustion in order to ensure a necessary effective exhaust amount.

Figure 4:
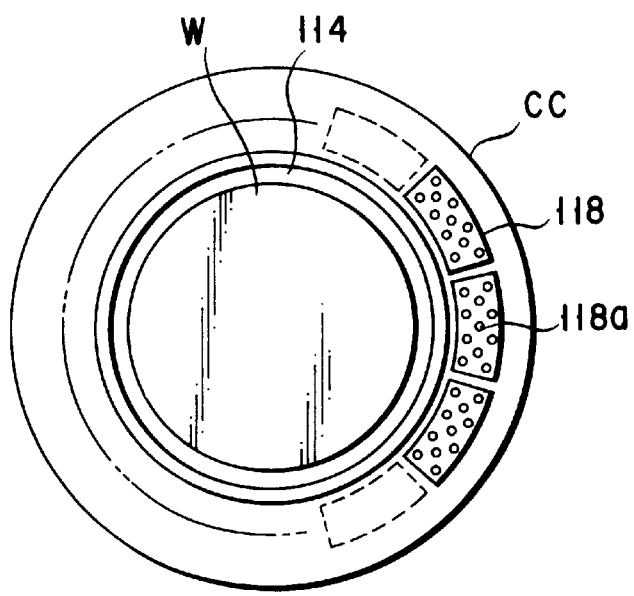
FIG. 4 is a schematic sectional view showing the state of a lower exhaust chamber side taken along the line IV—IV in FIG. 2 when viewed from the processing chamber side.

The susceptor 114 is arranged at the center of the processing chamber 101 to function as a table for supporting the target object such as the semiconductor wafer W, as shown in FIGS. 1 and 4, and as a lower electrode. The susceptor 114 is attached to the bottom plate of the lower casing part LC for constituting the main part of the lower exhaust chamber 105. When the three casing parts CC, UC, and LC are separated, the susceptor 114 is accompanied by the lower casing part LC, and separated from the central casing part CC. As will be described later, the susceptor 114 is vertically movable. When its upper surface, i.e., a support surface 114a is present at an upper position, as shown in FIG. 1, it defines the center of the bottom portion of the processing chamber 101. FIG. 4 is a sectional view of the bottom of the processing chamber 101 taken along the line IV—IV in FIG. 2 when viewed from the processing chamber 101 side toward the lower exhaust chamber 105 side.

The susceptor 114 is arranged in a conductive holder 115, such that the susceptor 114 is surrounded by an insulating plate 111a and an insulating ring 111b, made of, e.g., ceramics, and electrically separated from the holder 115. The conductive holder 115 is grounded through a conductive hollow tube 116 extending through the central portion of the lower exhaust chamber 105 (to be described later). Ball screw mechanisms 121 each having a vertical axis for elevating are connected to the holder 115. The ball screw mechanisms 121 are driven by an external motor (not shown), so that the holder 115 is moved along with the susceptor 114 and the hollow tube 116 in a vertical direction.

In loading/unloading the target object W in/from the processing chamber 101, the susceptor 114 is moved down to locate the support surface 114a at a lower position. At the lower position, the support surface 114a is flush with a gate valve 119 arranged on the side wall of the lower exhaust chamber 105. In etching, the susceptor 114 is moved up to locate the support surface 114a at the upper position. At the upper position, the upper surface of the target object W, i.e., the target processing surface placed on the support surface 114a is substantially flush with the upper surface of a lower baffle plate 118 (to be described later).

To ensure the airtightness of the processing chamber 101 and the lower exhaust chamber 105, an extendible airtight member, i.e., a bellows 120 is arranged between the susceptor 114 and the bottom portion of the lower exhaust chamber 105. A feed path 113 communicating with the susceptor 114 is arranged inside the hollow tube 116. In processing, an RF power of, e.g., 13.56 MHz is applied from an RF power supply 117 to the susceptor or lower electrode 114. As a result, the processing gas introduced into the processing chamber 101 can be converted into a plasma to perform a predetermined plasma process for the target object W.

The susceptor 114 is made of aluminum having an anodized surface. A temperature adjustment means, e.g., a heating means (not shown) such as a ceramic heater, and a coolant circulating path (not shown) for circulating a coolant between the susceptor 114 and an external coolant source (not shown) are arranged inside the susceptor 114. With this arrangement, the target object W placed on the susceptor 114 can be kept at a predetermined temperature. This temperature is automatically controlled by a temperature sensor (not shown) and a temperature control mechanism (not shown). An electrostatic chuck (not shown) or a mechanical clamp mechanism (not shown) for fixing the target object W on the susceptor 114 are arranged on the support surface of the susceptor 114.

As shown in FIGS. 1 and 4, the lower baffle plate 118 having many lower exhaust holes 118a formed therein is arranged to surround the support surface 114a, at the upper position, of the susceptor 114. At this upper position, the upper surface of the target object W, i.e., the target processing surface placed on the support surface 114a is set substantially flush with the upper surface of the lower baffle plate 118. A suspension ring 118b for surrounding the central portion of the susceptor 114 in a close state is attached to the inner edge portion of the lower baffle plate 118. A ring groove 115a for receiving the distal end of the suspension ring 118b is formed on the periphery of the insulating ring 111b surrounding the susceptor 114.

The lower baffle plate 118 is constituted by part of the central casing part CC defining the processing chamber 101. When the central and lower casing parts CC and LC are combined, and the support surface 114a of the susceptor 114 comes to the upper position, the processing chamber 101 and the lower exhaust chamber 105 are partitioned in the form shown in FIG. 1. At this time, the processing chamber 101 and the lower exhaust chamber 105 are partitioned from each other by the lower baffle plate 118, and communicate with each other through the lower exhaust holes 118a. At this time, communication between the processing chamber 101 and the lower exhaust chamber 105 except for the lower exhaust holes 118a is essentially prevented because the suspension ring 118b surrounds the central portion of the susceptor 114 in a close state, while its distal end enters the ring groove 115a.

Similar to the upper exhaust hole 112a and the upper baffle plate 112, the diameter of the lower exhaust hole 118a and the installation area of the lower baffle plate 118 are designed to prevent the plasma from entering the lower exhaust chamber 105 and to keep the conductance in exhaustion in order to ensure a necessary effective exhaust amount. A focus ring consisting of silica or the like can be arranged at the inner peripheral portion of the lower baffle plate 118 to effectively direct the plasma on the target object W.

As described above, the processing chamber 101 is defined by the central casing part CC having a substantially smooth, integrally continuous inner wall surface exposed, except for the support surface of the susceptor 114. The processing chamber 101 can be picked up as the central casing part CC by separating the casing parts CC, UC, and LC. With this arrangement, not only the processing chamber 101 can be easily subjected to a maintenance operation, but also the potentials of portions except for the lower electrode (susceptor) 114 can be uniformed in processing. The reactive plasma generated in the processing chamber 101 can be effectively confined in the processing space (the space above the target object W), resulting in an increase in processing speed.

As described above, the upper exhaust chamber 103 is airtightly formed by combining the central and upper casing parts CC and UC. The upper exhaust chamber 103 defines a doughnut-like space having the same diameter as that of the processing chamber 101. The upper casing part UC for constituting the main part of the upper exhaust chamber 103 is made of, e.g., aluminum. The inner wall surface of the upper exhaust chamber 103 is anodized. The upper casing part UC is airtightly fit in the upper side of the central casing part CC. In assembling, the interiors of the processing chamber 101 and the upper exhaust chamber 103 communicate with each other through the upper exhaust holes 112a of the upper baffle plate 112.

When the central and upper casing parts CC and UC are combined, the shower head 107 is airtightly formed in the above-described form so as to close the lower end portion of the doughnut-like hole of the upper exhaust chamber 103. The processing gas supply pipe 106 extends through substantially the center of the doughnut-like hole of the upper exhaust chamber 103, and is connected to the shower head 107. A predetermined processing gas can be supplied into the processing chamber 101 through the gas supply holes 104 formed in the ceiling 102 of the processing chamber 101.

An upper evacuation member constituted by a turbo-pump 124 is connected to the upper exhaust chamber 103 via a flow regulating valve or upper pressure regulating valve 122 to allow evacuation of the processing chamber 101 through the upper exhaust holes 112a. As will be described later, the driving timing and exhaust amount of the upper evacuation member are controlled by a controller 128 which receives an output from a pressure sensor 126 arranged in the processing chamber 101.

The lower exhaust chamber 105 is airtightly formed by combining the central and lower casing parts CC and LC, as described above. The upper portion of the lower exhaust chamber 105 has a substantially cylindrical shape, similar to the processing chamber 101, and its lower portion which accommodates a driving unit such as an elevating mechanism for the susceptor 114 has a substantially rectangular shape (see FIG. 5). The lower casing part LC for constituting the main part of the lower exhaust chamber 105 also is made of, e.g., aluminum, similar to the upper casing part UC, and its inner wall surface is anodized. The lower casing part LC is airtightly fit in the lower side of the central casing part CC. In assembling, the interiors of the processing chamber 101 and the lower exhaust chamber 105 communicate with each other through the lower exhaust holes 118a of the lower baffle plate 118.

As described above, the vertically movable susceptor 114 is accommodated in substantially the center of the lower exhaust chamber 105. The gate valve 119 for loading/unloading the target object W is arranged on one wall of the rectangular lower portion of the lower exhaust chamber 105. The gate valve 119 communicates with a load-lock chamber (not shown) to allow a convey mechanism (not shown) such as a convey arm to load/unload the target object W in/from the etching apparatus 100 via the gate valve 119. In loading/unloading the target object W, the susceptor 114 is moved down to set its upper surface, i.e., the upper surface 114a to the lower position corresponding to the gate valve 119.

A lower evacuation member constituted by a turbo-pump 132 is connected to the lower exhaust chamber 105 via a flow regulating valve or lower pressure regulating valve 130 to allow evacuation of the processing chamber 101 through the lower exhaust holes 118a. The controller 128 controls the driving timings and exhaust amounts of the upper and lower evacuation systems, and the processing gas supply amount in accordance with an output from the pressure sensor 126.

When the upper and lower evacuation systems are simultaneously driven, the driving timings are synchronously controlled by the controller 128. When a necessary effective exhaust rate is not so high, either one of the evacuation systems can be selectively driven.

As described above, the plasma processing apparatus according to the present invention is characterized in that it is constituted by the upper exhaust chamber 103, the processing chamber 101, and the lower exhaust chamber 105, and that their casing parts can be separated from each other. That is, since these casing parts are constituted separably, maintenance can be performed more easily and immediately, compared to the conventional apparatus.

In particular, according to the present invention, since the processing chamber 101 is integrally constituted, potential differences in the processing chamber 101 except for the susceptor 114 can be eliminated to promote confinement of the plasma. At the same time, the processing chamber 101 itself can be easily dismounted from the apparatus to facilitate maintenance of the inside of the processing chamber 101 which is readily damaged by plasma processing. When the surface of the anodized film constituting the inner wall of the processing chamber 101 is coated, as described above, if any damage to the coating material is found, after processing of a predetermined lot completes, or after a predetermined time elapses, a recoating process can be easily performed for the dismounted processing chamber 101.

Figure 5:
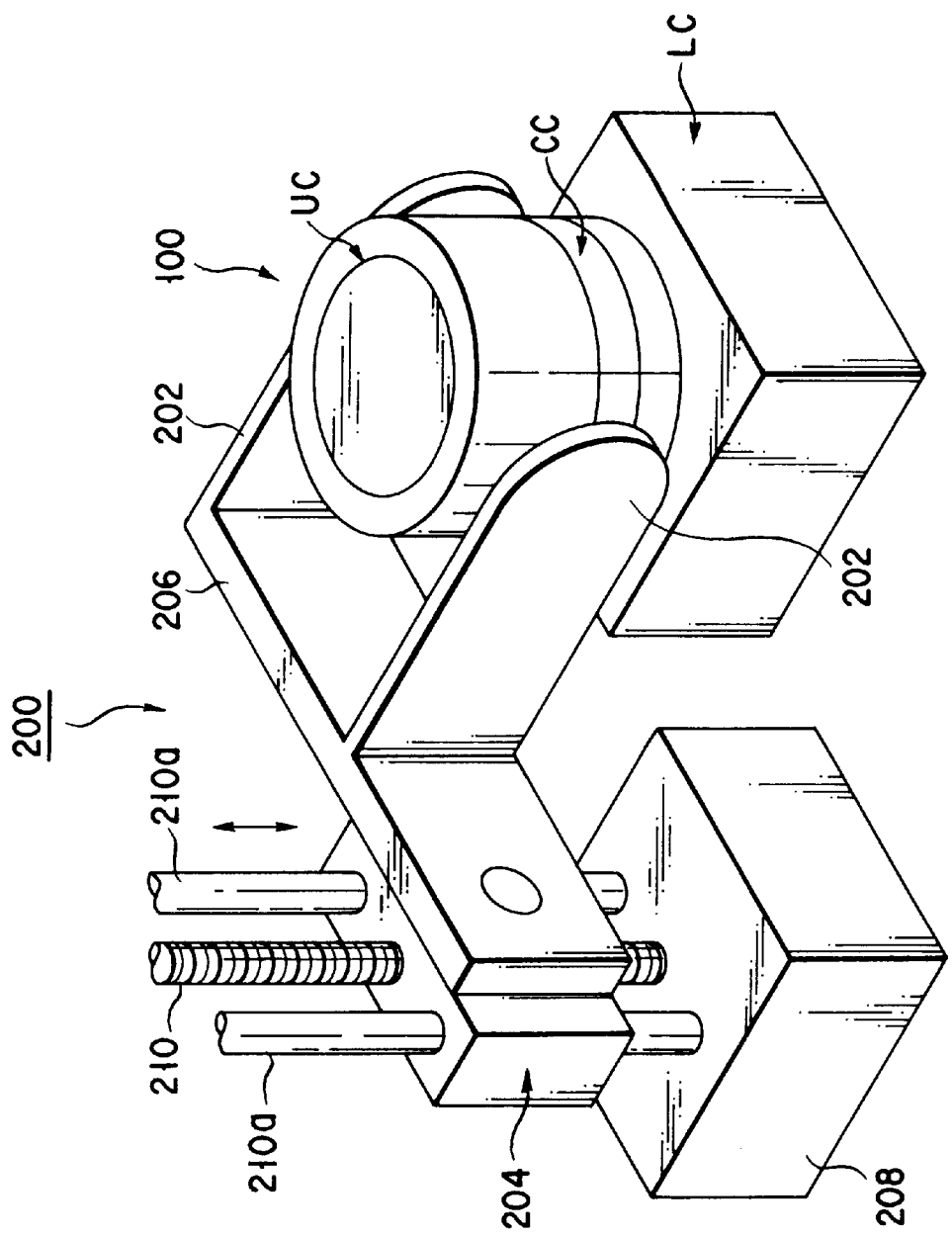
FIG. 5 is a schematic perspective view showing a mechanism for separating the casing parts of the apparatus shown in FIG. 1.

A mechanism 200 for separating the casing parts CC, UC, and LC of the etching apparatus 100 according to this embodiment, and its operation will be described below with reference to FIGS. 5 and 6. As shown in FIG. 5, the upper casing part UC of the etching apparatus 100 is fixed to two arms 202. The arms 202 are fixed to a base 206 rotatably attached to an elevating mechanism 204. The elevating mechanism 204 can be vertically moved along guide shafts 210 by rotating a trapezoidal screw 210 using a driving motor 208.

When the etching apparatus 100 is to be disassembled in maintenance, the elevating mechanism 204 is first moved up, and the upper and central casing parts UC and CC are separated from the lower casing part LC. The base 206 is rotated to reverse the upper and central casing parts UC and CC upside down, as shown in FIG. 6. By reversing the upper and central casing parts UC and CC upside down in this manner, their inside can be easily cleaned. In the example shown in FIGS. 5 and 6, the turbo-pump 124 (see FIG. 1) attached to the upper casing part UC is not illustrated. By the mechanism 200, the turbo-pump 124 can also be moved up and rotated together with the upper casing part UC. Instead of this, it is also possible that the turbo-pump 124 is dismounted from the upper casing part UC, and then the upper and central casing parts UC and CC are separated from the lower casing part LC.

Figure 6:
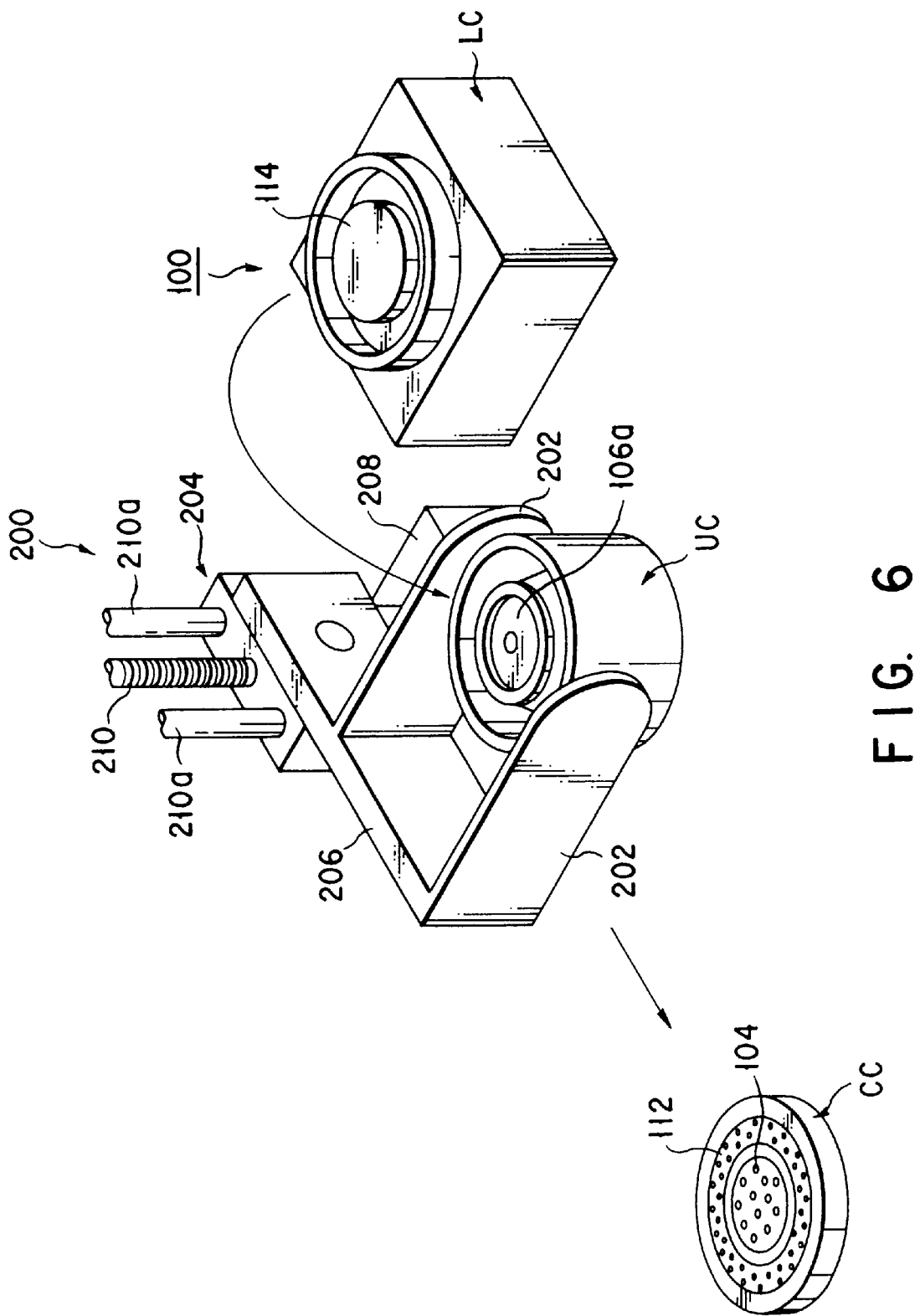
FIG. 6 is a schematic perspective view showing the state wherein the casing parts of the apparatus shown in FIG. 1 are separated using the mechanism shown in FIG. 5.

After the upper and central casing parts UC and CC are separated from the lower casing part LC in this manner, the central casing part CC is dismounted from the upper casing part UC, as shown in FIG. 6. In the example shown in FIGS. 5 and 6, the central casing part CC is manually dismounted by a maintenance person. Alternatively, it may be automatically dismounted using a robot art or the like. Assembling upon completion of the maintenance can be performed in an order reverse to the disassembling operation, and a detailed description thereof will be omitted.

An operation when the etching apparatus 100 according to this embodiment performs etching for an oxide film ($SiO_2$) on the semiconductor wafer W will be described in short.

Note that the upper, central, and lower casing parts UC, CC, and LC of the etching apparatus 100 have already been assembled.

The turbo-pump 124 connected to the upper exhaust chamber 103, and the turbo-pump 132 connected to the lower exhaust chamber 105 are interlockingly driven to reduce the pressure in the processing chamber 101 to a predetermined pressure through the upper exhaust holes 112a around the ceiling of the processing chamber 101 and the lower exhaust holes 118a around its bottom portion.

After the susceptor 114 is moved down to the position of the gate valve 119, the gate valve 119 communicating with the load-lock chamber (not shown) is opened. The wafer W is placed by the convey arm (not shown) on the susceptor 114 in the lower exhaust chamber 105, and chucked by the electrostatic chuck (not shown) to the susceptor 114. After retreat of the convey arm from the lower exhaust chamber 105 is confirmed, the gate valve 119 is closed, and the susceptor 114 is moved up to the processing position (the position shown in FIG. 1).

While exhausting the gas, a processing gas such as CF4 gas is supplied from the processing gas source 108 via the mass-flow controller 110 into the processing chamber 101 through the gas supply holes 104 in the lower surface of the upper electrode 102 of the processing chamber 101. The controller 128 which receives an output from the pressure sensor 126 arranged in the processing chamber 101 adjusts the operations of the upper and lower evacuation systems and the processing gas supply system to set and keep the interior of the processing chamber 101 at a predetermined pressure, e.g., 50 mTorr. That is, in the etching apparatus 100 according to this embodiment, the interior of the processing chamber 101 is evacuated by both the upper and lower exhaust chambers 103 and 105 set above and below. Even when the capacity of the processing chamber 101 increases along with increases in diameter and size of the target object, the interior of the processing chamber 101 can be easily adjusted and kept at a predetermined reduced-pressure atmosphere regardless of the conductances of the upper and lower exhaust holes 112a and 118a.

An RF power of, e.g., 13.56 MHz is applied from the RF power supply 117 to the lower electrode 114 to convert the processing gas introduced into the processing chamber 101 into a plasma. According to this embodiment, since the processing chamber 101 is integrally constituted except for the lower electrode 114, potential differences hardly occur in the processing chamber 101, and the plasma can be effectively confined in the processing space to increase the processing speed.

Upon completion of predetermined processing in the above manner, application of the RF power and supply of the processing gas are stopped. Then, the susceptor 114 is moved down to a convey position. The gate valve 119 is opened, and the processed wafer W is unloaded from the lower exhaust chamber 105 by the convey arm to complete a series of operations.

In maintaining the etching apparatus 100, the casing parts CC, UC, and LC are separated, and each part is subjected to a maintenance operation. The operation of separating these casing parts has already been described with reference to FIGS. 5 and 6, and a repetitive description thereof will be omitted.

Figure 7:
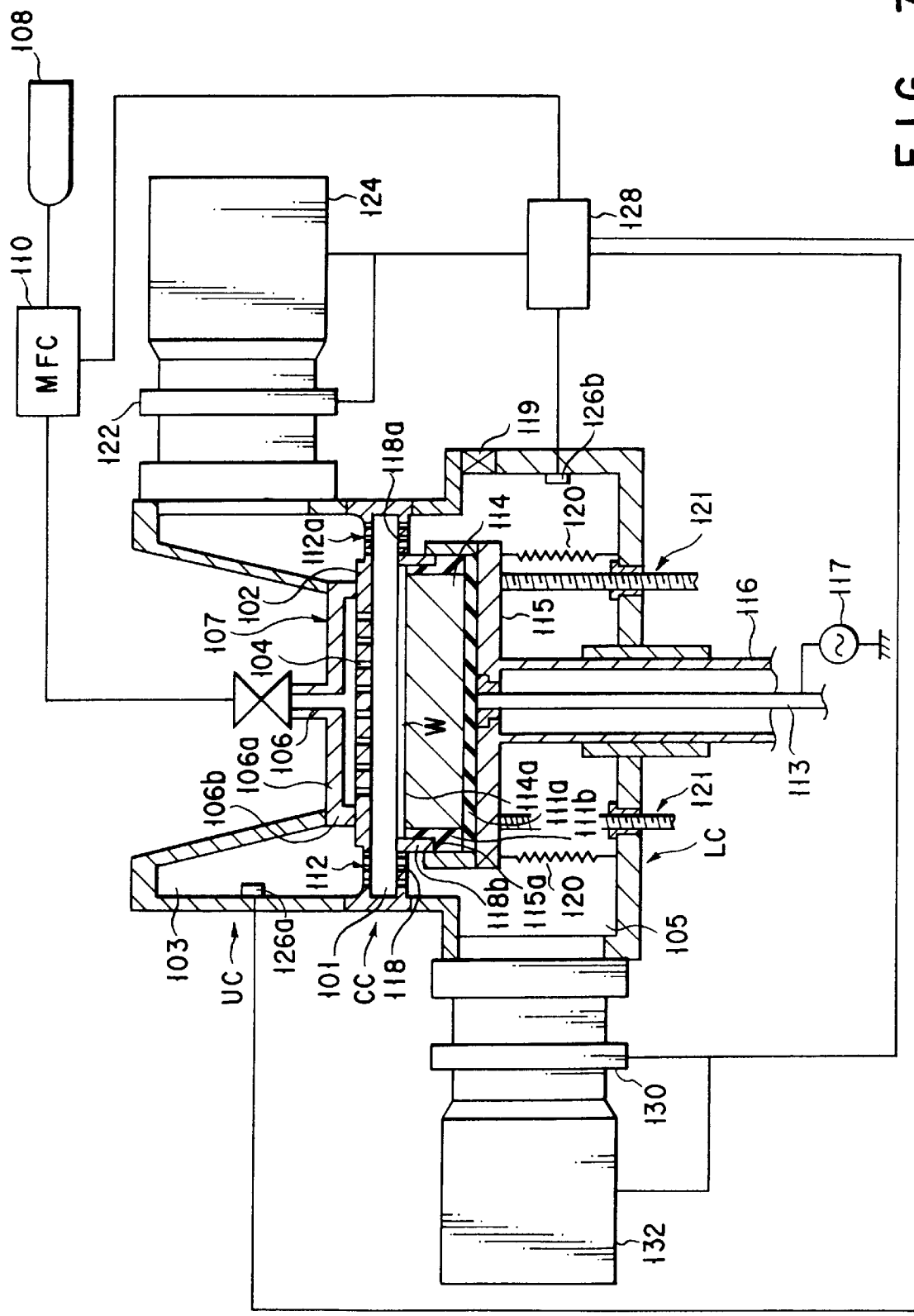
FIG. 7 is a schematic view showing the arrangement of a plasma etching apparatus as a plasma processing apparatus according to another embodiment of the present invention.

FIG. 7 is a schematic view showing the arrangement of a plasma etching apparatus as a plasma processing apparatus according to another embodiment of the present invention. This embodiment is different from the embodiment shown in FIG. 1 in that pressure sensors 126a and 126b are respectively arranged in upper and lower exhaust chambers 103 and 105. Since the remaining constituent elements are the same as those in the embodiment shown in FIG. 1, the same reference numerals denote the same parts, and a description thereof will be omitted.

In the etching apparatus shown in FIG. 7, the pressure in a processing chamber 101 is controlled on the basis of the pressure difference between the upper and lower exhaust chambers 103 and 105. Detailed control will be explained with reference to a flow chart (steps S200 to S280) shown in FIG. 8. Note that setting and adjustment of the openings of upper and lower pressure regulating valves 122 and 130, which are the main point of the pressure control method to be described below, can be performed without the pressure sensors 126a and 126b of the upper and lower exhaust chambers 103 and 105, but using only the pressure sensor 126 of the processing chamber 101 as a pressure detection means, like in the embodiment shown in FIG. 1.

Figure 8:
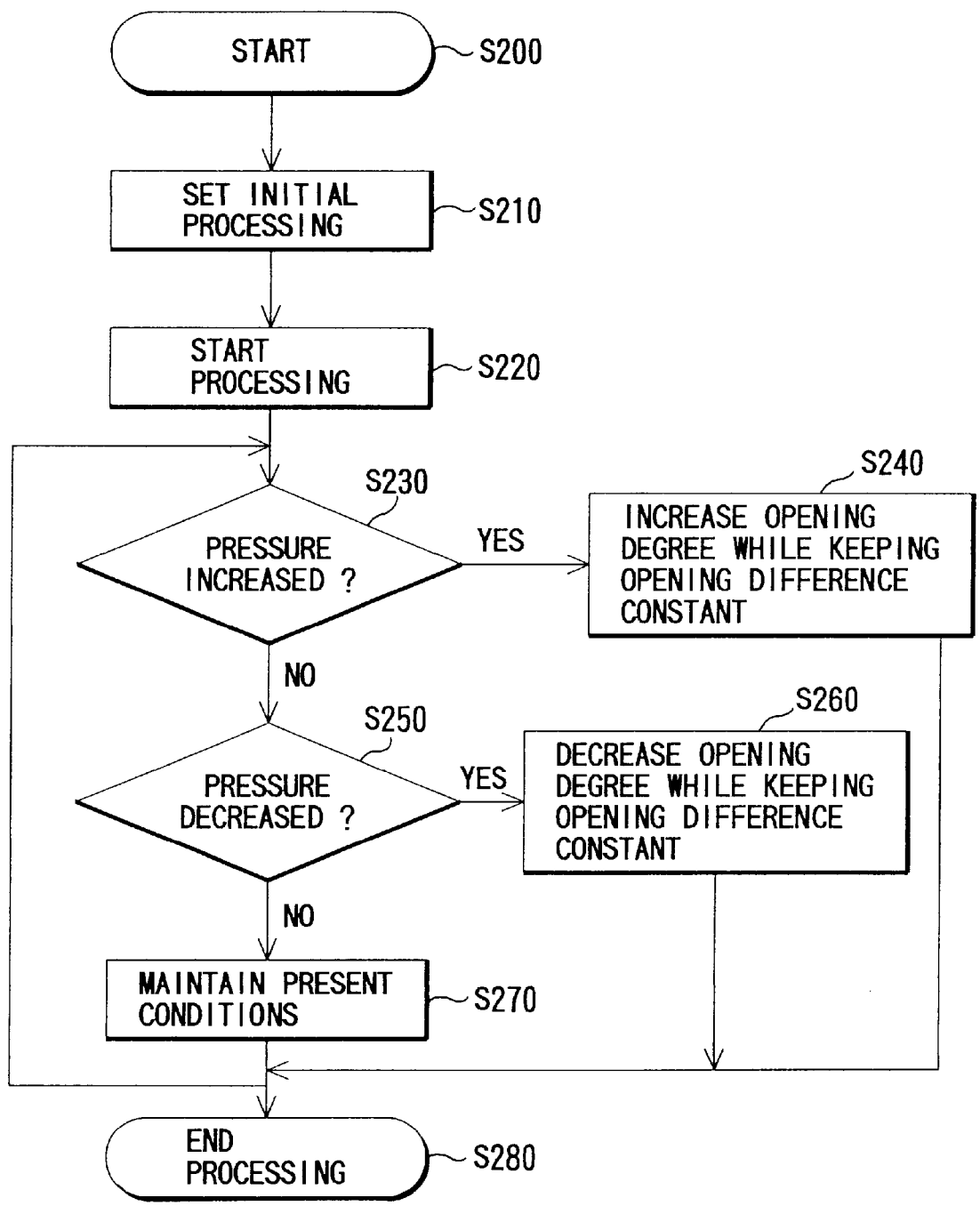
FIG. 8 is a flow chart showing a method of controlling the processing pressure in the apparatus shown in FIG. 7.

In FIG. 8, a target object W is placed on a susceptor 114 in the processing chamber 101 in the above described manner (step S200). The openings of the upper and lower pressure regulating valves 122 and 130, and the set value of the pressure are input to a controller 128 (step S210). This set value is obtained in advance by a simulation or an experiment using a dummy wafer or the like in order to cause an optimal difference in exhaust amount between the upper and lower exhaust chambers 103 and 105 so as to form a desired gas flow in the processing chamber 101.

The upper and lower pressure regulating valves 122 and 130 are adjusted to predetermined opening degrees by an electrical signal from the controller 128. Upper and lower evacuation pumps 124 and 132 during operation perform evacuation to reduce the pressures in the processing chamber 101, the upper exhaust chamber 103, and the lower exhaust chamber 105 to predetermined pressures set in advance. Then, processing starts (step S220).

The upper and lower pressure sensors 126b are respectively arranged in the upper and lower exhaust chambers 103 and 105 to measure the pressures in the respective discharge chambers and transmit detection signals to the controller 128. The controller 128 always monitors the pressures to attain, in the upper and lower exhaust chambers 103 and 105, pressures for causing an optimal gas flow in the processing chamber.

Since the final control target of the pressure control method is the pressure in the processing chamber, only the pressure sensor 126 of the processing chamber 101 may be used as the pressure detection means to control the upper and lower exhaust pumps 124 and 132 so as to adjust the detection value of the pressure sensor 126 to a predetermined value, as shown in FIG. 1. However, it is advantageous to respectively arrange the pressure sensors in the upper and lower exhaust chambers 103 and 105 to control the gas flow in the processing chamber 101 because the arrangement conditions of the pressure sensors in the exhaust chambers 103 and 105 are relatively loose.

Particularly, according to this embodiment, the upper and lower exhaust systems are controlled to keep the difference in exhaust amount constant. The difference in pressure can be controlled to an optimal value by associating the optimal value of the pressure in the processing chamber 101 with the difference in pressure between the upper and lower exhaust chambers 103 and 105 in advance.

For example, assume that an increase in pressure in the processing chamber 101 is determined from a change in pressure difference between the upper and lower exhaust chambers 103 and 105 (step S230). In this case, the controller 128 increases the opening degrees of the upper and lower pressure regulating valves 122 and 130, while the set opening difference, i.e., difference in exhaust amount between the upper and lower pressure regulating valves 122 and 130 is kept constant. With this operation, the pressure in the processing chamber 101 can be quickly decreased to a predetermined pressure by a simple control system free from any disturbance (step S240).

To the contrary, assume that a decrease in pressure in the processing chamber 101 is determined from a change in pressure difference between the upper and lower exhaust chambers 103 and 105 (step S250). In this case, the controller 128 decreases the opening degrees of the upper and lower pressure regulating valves 122 and 130, while maintaining the set opening difference, i.e., pressure difference between the upper and lower pressure regulating valves 122 and 130. With this operation, the pressure in the processing chamber 101 can be quickly increased to a predetermined pressure (step S260).

When it is determined that the pressure difference between the upper and lower exhaust chambers 103 and 105 falls within a predetermined value, and therefore the pressure in the processing chamber 101 falls within a set value, processing is continued without any step (step S270). In this manner, a desired gas flow can be formed in the processing chamber 101 to generate a uniform plasma, thereby performing predetermined processing for the target object W by using the plasma flow (step S280).

Figure 9A:
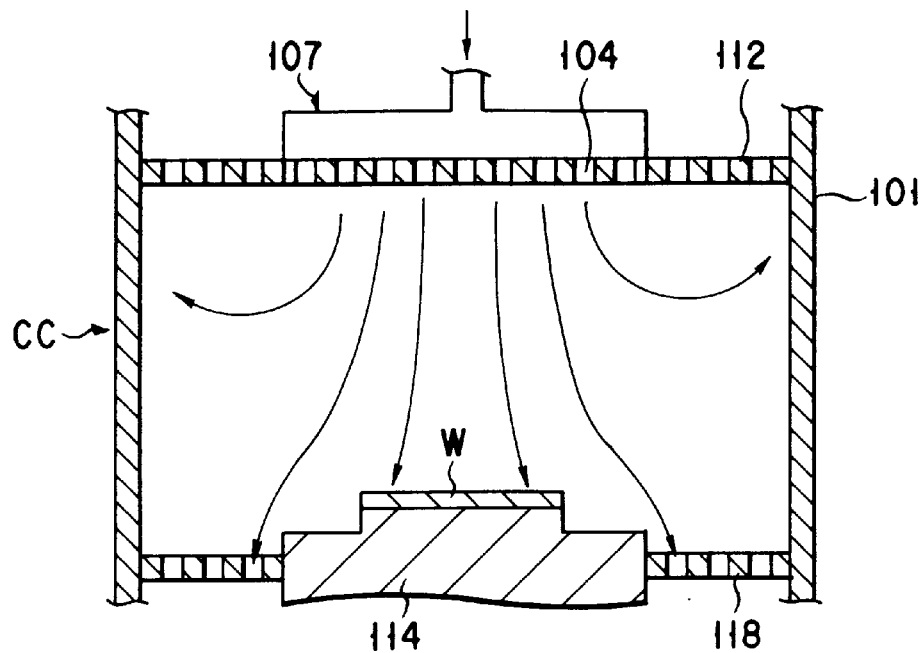
FIGS. 9A and 9B are views, respectively, showing the gas flow in the processing chamber of the apparatus shown in FIG. 7.
Figure 9B:
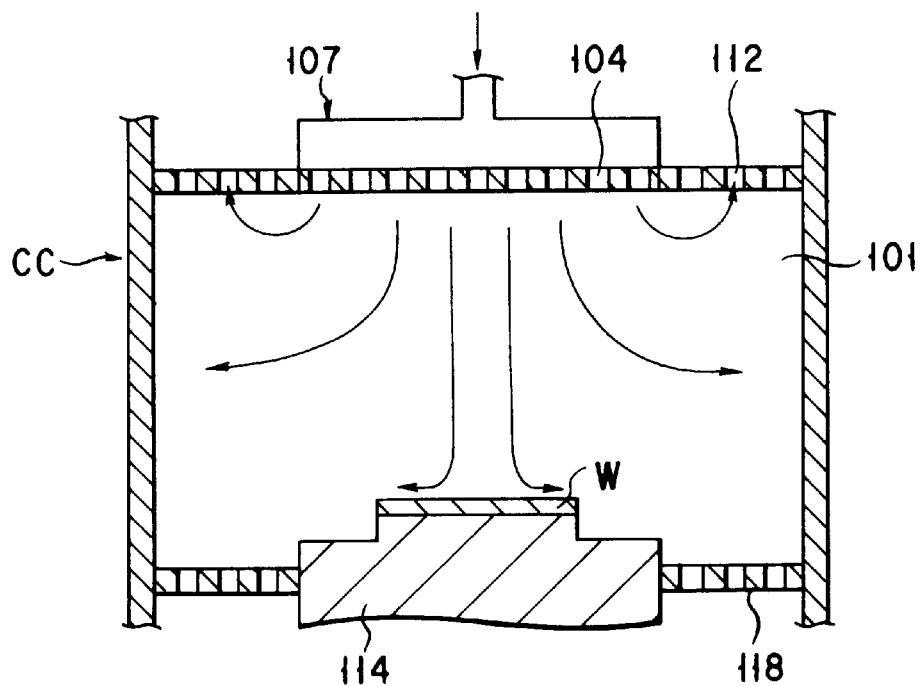

An example of control of the gas flow, i.e., control of the plasma flow in the processing chamber 101 will be described with reference to FIGS. 9A and 9B. For example, assume that the upper pressure regulating valve 122 is set to a predetermined opening degree, and the opening degree of the lower pressure regulating valve 130 is increased to be larger than that of the upper pressure regulating valve 122, or that the lower pressure regulating valve 130 is set to a predetermined opening degree, and the opening degree of the upper pressure regulating valve 122 is decreased to be smaller than that of the lower pressure regulating valve 130. In this case, the ratio of the plasma flow in the processing chamber 101 flowing toward the lower exhaust chamber 105 becomes higher than the ratio flowing toward the upper exhaust chamber 103, as shown in FIG. 9A.

Assume that the upper pressure regulating valve 122 is set to a predetermined opening degree, and the opening degree of the lower pressure regulating valve 130 is decreased to be smaller than that of the upper pressure regulating valve 122, or that the lower pressure regulating valve 130 is set to a predetermined opening degree, and the opening degree of the upper pressure regulating valve 122 is increased to be larger than that of the lower pressure regulating valve 130. In this case, the ratio of the gas flow (plasma flow) flowing toward the upper exhaust chamber 103 increases, as shown in FIG. 9B.

In the embodiments shown in FIGS. 1 and 7, therefore, to perform a uniform plasma process for the target object W, the optimal opening degrees of the upper and lower pressure regulating valves 122 and 130 are obtained experimentally or by a simulation, and the obtained values are set in the controller 128. Only with this setting, the gas flow in the processing chamber can be optimally controlled by a simple control system free from any disturbance.

The pressure sensor 126 is arranged in the processing chamber 101 in the embodiment shown in FIG. 1, while the pressure sensors 126a and 126b are respectively arranged in the upper and lower exhaust chambers 103 and 105 in the embodiment shown in FIG. 7. However, as the pressure detection means, pressure sensors may be arranged in all or any one or two of the processing chamber 101 and the upper and lower exhaust chambers 103 and 105. That is, in the present invention, the pressure sensor can be arranged at any location of the processing apparatus in order to optimize the gas flow in the processing chamber 101 as far as the gas flow in the processing chamber 101 is associated with the detection value of the pressure sensor.

Figure 10:
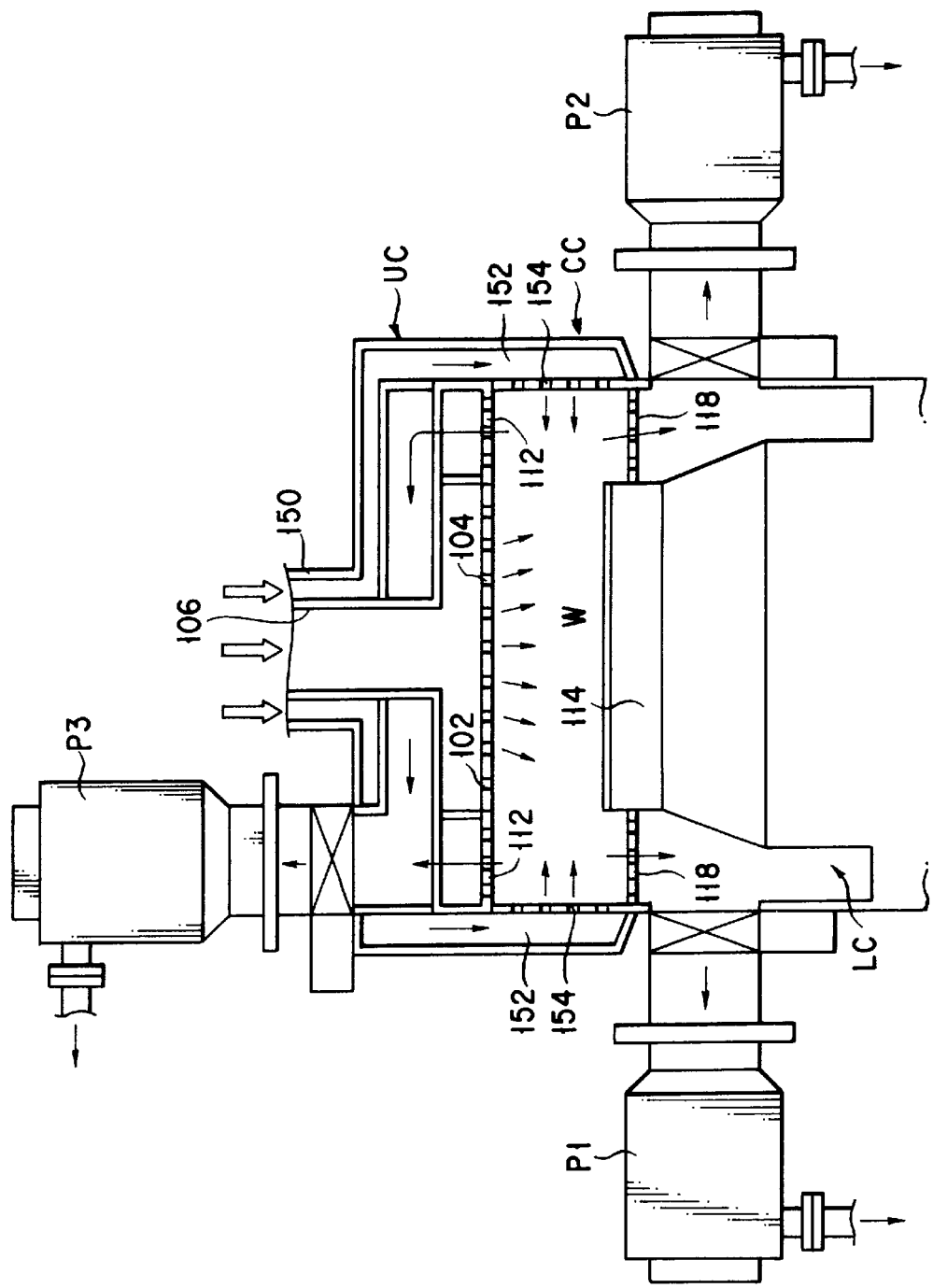
FIG. 10 is a schematic view showing the arrangement of a plasma etching apparatus as a plasma processing apparatus according to still another embodiment of the present invention.
Figure 11:
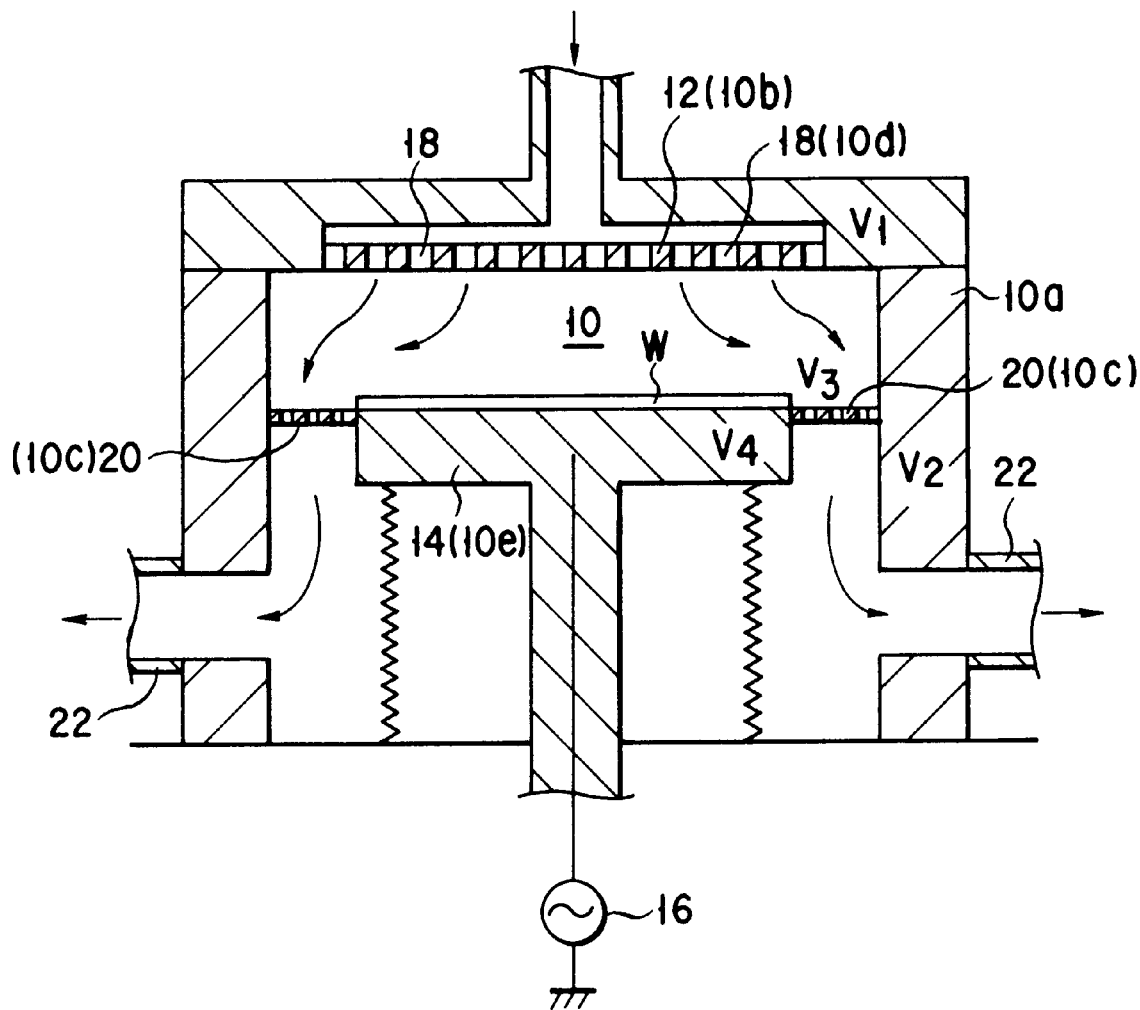
FIG. 11 is a schematic view showing the arrangement of a conventional plasma etching apparatus.

FIG. 10 is a schematic view showing the arrangement of a plasma etching apparatus as a plasma processing apparatus according to still another embodiment of the present invention. In FIG. 10, the same reference numerals denote parts corresponding to those in the embodiment shown in FIG. 1, and a description thereof will be omitted.

As for the evacuation system, in the embodiments shown in FIGS. 1 and 7, one evacuation pump is connected to each of the upper and lower exhaust chambers 103 and 105. Instead of this, for example, one evacuation pump may be branched into two systems, which are respectively connected to upper and lower exhaust chambers 103 and 105. Alternately, a plurality of evacuation pumps may be connected to the upper and lower exhaust chambers 103 and 105. When a higher effective exhaust rate is required, two evacuation pumps P1 and P2 can be connected to the lower exhaust chamber 105, while one evacuation pump P3 can be connected to the upper exhaust chamber 103, as shown in FIG. 10. In this case, the three evacuation pumps P1 to P3 are driven synchronously or selectively.

As for the gas supply system, in the embodiments shown in FIGS. 1 and 7, only one gas supply system for supplying the processing gas through the gas supply holes 104 formed in the upper electrode 102 of the processing chamber 101 is arranged. However, according to the present invention, a plurality of gas supply systems may be arranged to supply a gas from a plurality of portions into a processing chamber 101. With this arrangement, even when the capacity of the processing chamber 101 increases along with increases in diameter and size of the target object, a sufficient amount of processing gas can be uniformly distributed in the processing chamber 101. From this viewpoint, in the embodiment shown in FIG. 10, another gas supply system 150 is arranged in addition to the gas supply system shown in FIG. 1. The gas supply system 150 has a gas supply path 152 arranged around the outer side wall of the processing chamber 101. Therefore, the processing gas can be introduced into the processing chamber 101 also through processing gas supply holes 154 formed in the side wall of the processing chamber 101.

Although the RF power supply is connected to only the lower electrode 114 in the embodiments shown in FIGS. 1 and 7, the present invention is not limited to these embodiments. For example, the present invention is applicable to a plasma processing apparatus in which an RF power supply is also connected to the upper electrode, and RF powers having different phases can be supplied to the upper and lower electrodes to control the plasma density.

The above embodiments exemplify the apparatus for etching a silicon oxide film ($SiO_2$) on the surface of the semiconductor wafer. However, the present invention is not limited to these embodiments, and can be constituted as an apparatus for performing another etching process. The apparatus to which the present invention is applicable is not limited to the etching apparatus for performing etching, and the present invention is applicable to apparatuses for performing various processes, e.g., ashing, sputtering, and CVD processing, for the target object by using the plasma. Further, the target object is not limited to the wafer, and the present invention is applicable to processing of an LCD substrate.

Although the preferred embodiments of the present invention have been described with reference to the several views of the accompanying drawing, the present invention is not limited to the above arrangements. Various changes and modifications of the present invention will be apparent to those skilled in the art within the technical scope described in the following claims, and also belong to the technical scope of the present invention.

What is claimed is:

1. An apparatus for processing a target object using a plasma, comprising:
    an airtight processing chamber;
    a work table having a support surface for supporting said target object in said processing chamber;
    upper and lower exhaust systems for jointly evacuating an interior of said processing chamber and jointly exhausting a gas on said target object, said upper and lower exhaust systems flowing gas in said processing chamber upward and downward, respectively;
    a gas supply system for supplying a processing gas to said processing chamber; and
    an electric field generator for generating, in said processing chamber, an electric field for converting said processing gas into a plasma through discharge.

2. An apparatus according to claim 1, wherein said upper exhaust system has an upper exhaust chamber arranged above said processing chamber, and a plurality of upper exhaust holes formed in an upper partition plate between said processing chamber and said upper exhaust chamber.

3. An apparatus according to claim 2, wherein said gas supply system has a supply port which opens above said work table, and said upper exhaust holes are arranged to surround said supply port.

4. An apparatus according to claim 3, wherein said gas supply system comprises a shower head arranged above said work table, and said shower head has a diffusion plate in which a plurality of supply holes functioning as said supply port are formed.

5. An apparatus according to claim 4, wherein said partition plate and said upper diffusion plate form one ceiling plate for defining a ceiling of said processing chamber.

6. An apparatus according to claim 5, wherein said processing chamber, except for said support surface of said work table, is defined by a central casing part having an integrally continuous inner wall surface exposed in said processing chamber, and a potential on said inner wall surface is set substantially uniform.

7. An apparatus according to claim 6, wherein said upper exhaust chamber and said shower head are airtightly formed by said central casing part, and an upper casing part which is separably combined with said central casing part.

8. An apparatus according to claim 3, wherein said lower exhaust system has a lower exhaust chamber arranged below said processing chamber, said lower exhaust chamber has a gate for loading/unloading said target object therein/ therefrom, and said work table can vertically move to move said support surface between a lower position in said lower exhaust chamber and an upper position in said processing chamber.

9. An apparatus according to claim 8, wherein said lower exhaust system has a plurality of lower exhaust holes formed in a lower partition plate between said processing chamber and said lower exhaust chamber.

10. An apparatus according to claim 9, wherein said processing chamber, except for said support surface of said work table, is defined by a central casing part having an integrally continuous inner wall surface exposed in said processing chamber, and a potential on said inner wall surface is set substantially uniform.

11. An apparatus according to claim 10, wherein said lower exhaust chamber is airtightly formed by said central casing part, and a lower casing part which surrounds said work table and is separably combined with said central casing part.

12. An apparatus according to claim 1, further comprising a controller for interlocking said upper and lower exhaust systems.

13. An apparatus according to claim 12, wherein said controller controls said upper and lower exhaust systems to keep a difference in exhaust amounts between said upper and lower exhaust systems constant in performing a process.

14. An apparatus according to claim 13, wherein said upper and lower exhaust systems respectively have upper and lower pressure regulating valves, and said controller controls said upper and lower exhaust systems to keep a difference in opening degrees between said upper and lower pressure regulating valves constant in performing a process.

15. An apparatus for processing a target object using a plasma, comprising:
    an airtight processing chamber;
    a work table having a support surface for supporting said target object in said processing chamber;
    an exhaust system for evacuating an interior of said processing chamber and exhausting a gas on said target object;
    a gas supply system for supplying a processing gas to said processing chamber; and
    an electric field generator for generating, in said processing chamber, an electric field for converting said processing gas into a plasma through discharge,
    wherein said processing chamber, except for said support surface of said work table, is defined by a central casing part having an integrally molded continuous conductive inner wall surface exposed in said processing chamber, said inner wall surface has a ceiling surface and a floor surface corresponding to a ceiling and a floor of said processing chamber, and a potential on said inner wall surface is set substantially uniform, and
    wherein said ceiling surface has first holes used as part of said gas supply system for supplying said processing gas, and said floor surface has second holes used as part of said exhaust system for evacuating the interior of said processing chamber.

16. An apparatus according to claim 15, wherein said inner wall surface is formed substantially smooth.

17. An apparatus according to claim 15, wherein said exhaust system comprises an upper exhaust system, wherein said upper and lower exhaust systems flow gas in said processing chamber upward and downward, respectively.

18. An apparatus according to claim 17, wherein said upper exhaust system has an upper exhaust chamber arranged above said processing chamber, said gas supply system has a shower head arranged above said work table, and said upper exhaust chamber and said shower head are airtightly formed by said central casing part, and an upper casing part which is separably combined with said central casing part.

19. An apparatus according to claim 15, wherein said exhaust system comprises a lower exhaust system including a lower exhaust chamber arranged below said processing chamber, said lower exhaust chamber has a gate for loading/unloading said target object therein/therefrom, and said work table can vertically move to move said support surface between a lower position in said lower exhaust chamber and an upper position in said processing chamber.

20. An apparatus according to claim 19, wherein said lower exhaust chamber is airtightly formed by said central casing part, and a lower casing part which surrounds said work table and is separably combined with said central casing part.

* * * * *